United States Patent [19]

Crooks

[11] Patent Number: 4,607,225

[45] Date of Patent: Aug. 19, 1986

[54] APPARATUS AND METHOD FOR REDUCING SPURIOUS CURRENTS IN NMR IMAGING APPARATUS INDUCED BY PULSED GRADIENT FIELDS

[75] Inventor: Lawrence E. Crooks, Richmond, Calif.

[73] Assignee: Regents of the University of California, Berkeley, Calif.

[21] Appl. No.: 515,116

[22] Filed: Jul. 19, 1983

[51] Int. Cl.$^4$ ............................................. G01R 33/20
[52] U.S. Cl. ..................................... 324/318; 324/319
[58] Field of Search ............... 324/309, 311, 313, 314, 324/318, 322, 225, 241, 244, 319, 320; 336/69; 307/109, 110, 89, 90, 91; 361/139, 143, 146

[56] References Cited

U.S. PATENT DOCUMENTS

| | | | |
|---|---|---|---|
| 2,686,270 | 8/1954 | Ayres | 307/89 |
| 3,434,043 | 3/1969 | Nelson | 324/310 |
| 3,469,180 | 9/1969 | Anderson | 324/320 |
| 3,673,465 | 6/1972 | Tschopp | 361/146 |
| 4,021,726 | 5/1977 | Garroway | 324/309 |
| 4,052,661 | 10/1977 | Higham | 324/322 |
| 4,075,552 | 2/1978 | Traficante | 324/322 |
| 4,297,637 | 10/1981 | Crooks | 324/309 |
| 4,509,011 | 4/1985 | Sugimoto | 324/309 |

OTHER PUBLICATIONS

Joseph Tartas, *How to Select R. F. Chokes*, May, 1966, p. 51, Electronics World.

*Primary Examiner*—Michael J. Tokar
*Attorney, Agent, or Firm*—Nixon & Vanderhye

[57] ABSTRACT

NMR imaging apparatus having at least one pulsed magnetic field gradient coil generating pulsed magnetic gradient fields and having at least one other coil structure magnetically linked thereto (and therefore subject to induced pulsed currents which create opposing magnetic fields if permitted to flow) includes apparatus connected in circuit with the other coil structure for suppressing such induced currents. The suppression is effected by causing the other coil structure to have increased electrical impedance with respect to such induced currents. Where the other coil structure is a radio frequency transmit/receive coil having plural parallel connected turns, the suppression apparatus includes at least one capacitor in series with at least some of the turns so as to present a substantially open circuit condition at the relatively lower frequencies of the unwanted induced currents. Where the other coil is a static field profiling or "shimming" coil, it is driven with a wide-band current source so as to counteract the unwanted induced currents.

9 Claims, 14 Drawing Figures

FIG. 3
(PRIOR ART)
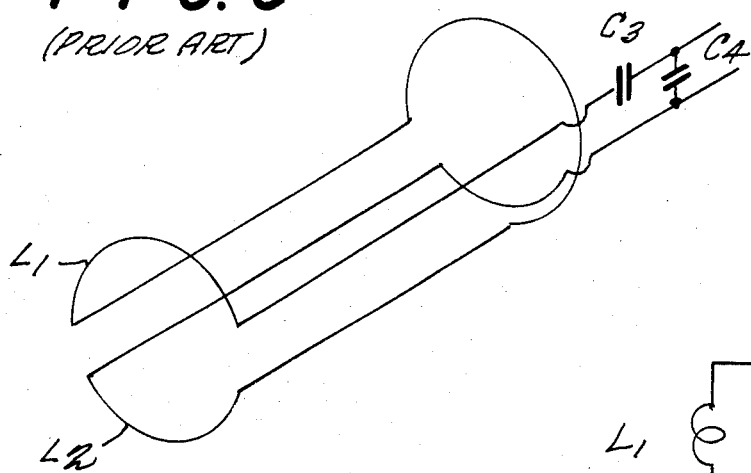
FIG. 4
(PRIOR ART)
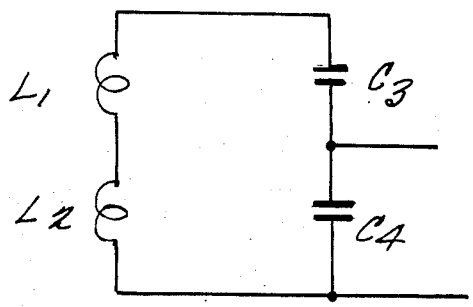
FIG. 5
(PRIOR ART)
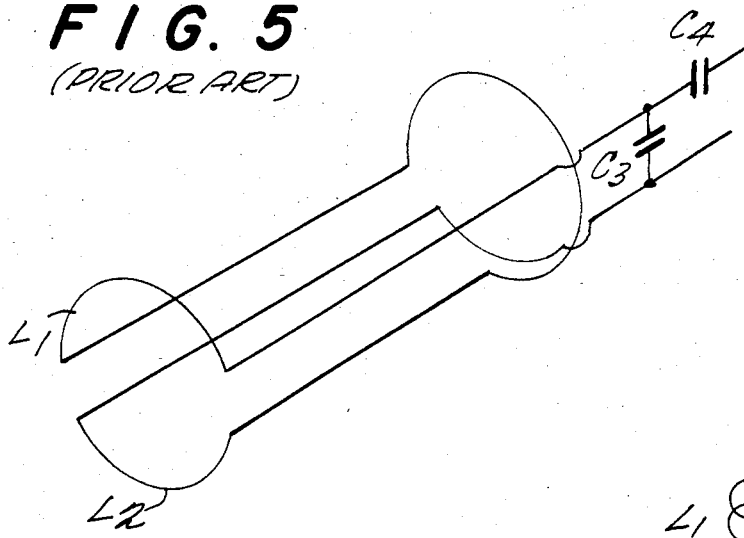
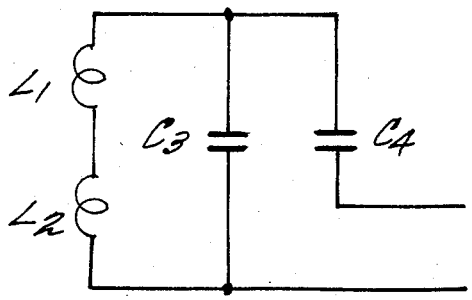
FIG. 6
(PRIOR ART)

APPARATUS AND METHOD FOR REDUCING SPURIOUS CURRENTS IN NMR IMAGING APPARATUS INDUCED BY PULSED GRADIENT FIELDS

This invention is generally directed to method and apparatus for reducing spurious induced currents in NMR imaging apparatus otherwise caused by pulsed gradient fields. More particularly, it is at least in part directed toward suppressing induced opposition fields and thereby increasing the rapidity by which the gradient fields can be switched.

The method and apparatus of this invention will find use, for example, in NMR imaging apparatus of the type disclosed in commonly assigned U.S. Pat. Nos. 4,297,637 and 4,318,043. It will also be useful in any other type of NMR imaging apparatus which uses pulsed gradient fields. As will be understood by those familiar with known NMR imaging techniques, they all derive spatial resolution from detected NMR response signals by applying various magnetic gradients at various times throughout the object under test during a data gathering cycle. In this manner, the Lamour NMR frequency is controllably changed from one spatial location to another within the object thereby encoding the spatial location of the NMR generating nuclei within the frequency/phase of the radio frequency NMR response signal.

To acquire sufficient NMR response signal data to produce a cross-sectional image or the like of reasonable resolution within a relatively short time, it is typically necessary to rapidly change such magnetic gradient fields. For example, certain gradient fields may be rapidly switched "on" and then "off" in particular sequences so as to elicit a desired NMR response signal from the object to be imaged. The details of such NMR imaging procedures can be found in published prior art such as the above-referenced issued U.S. patents and the like.

In addition to the magnetic gradient coils and a primary static field magnetic coil, there are typically also other coil structures located in the vicinity of the pulsed gradient fields. For example, the radio frequency NMR signal responses are typically transduced via a radio frequency antenna coil or coils. Furthermore, to help ensure homogeneity of the static magnetic field, there may typically be so called "profiling" or "shimming" coils provided in one or more dimensions.

Since these other coils are in the vicinity of the gradient coils, they are also typically linked to the magnetic flux generated by the pulsed gradient field coils. Since the gradient field coils are typically being pulsed at a fairly rapid rate (e.g. at an audio frequency), the pulsed fields can therefore be expected to generate induced currents in such "other" coils.

In accordance with Lenz's well known law, these induced currents will, in turn, generate their own magnetic fields which will tend to oppose the desired gradient field. Of course, after the current in the gradient coil remains at a fairly constant level for a sufficient time, these induced currents will begin to decay and the opposition magnetic field will similarly decay so as to leave remaining the desired magnetic gradient field. Nevertheless, these induced currents/fields will effectively limit the rapidity with which the gradient fields can be successfully pulsed "on" and "off" to obtain the desired NMR responses.

However, I have now discovered that it is possible to minimize such undesirable effects. In short, the unwanted induced magnetic fields opposing the desired gradient fields are reduced by reducing the flow of induced currents in these "other" coils. Thus, in the exemplary embodiment (described in more detail below), each of the "other" coils magnetically linked to the gradient coils is effectively terminated with an open circuit or other relatively high electrical impedance at the frequencies of the spurious induced currents.

For example, with respect to the static field homogenization coils (sometimes also called "shimming" or "profiling" coils), this goal may be achieved by driving the shimming coil with a wide band current source. For the radio frequency transmit/receive coil, the impedance of the coil at the essentially audio frequencies of the gradient field pulses (and therefore of the unwanted induced currents) can be greatly increased by inserting one or more capacitors in series with parallel connected sections of the r.f. coil. These capacitors will present a relatively high impedance to the unwanted induced audio frequency currents while still providing a relatively low electrical impedance to the radio frequencies of interest (e.g. at about 15 Megahertz or so).

These as well as other objects and advantages of this invention will be better appreciated by carefully reading the following detailed description of the presently preferred exemplary embodiment of this invention in conjunction with the accompanying drawings, of which:

FIGS. 3–9 illustrate various prior art r.f. transmit/receive coil arrangements;

Figure 1:
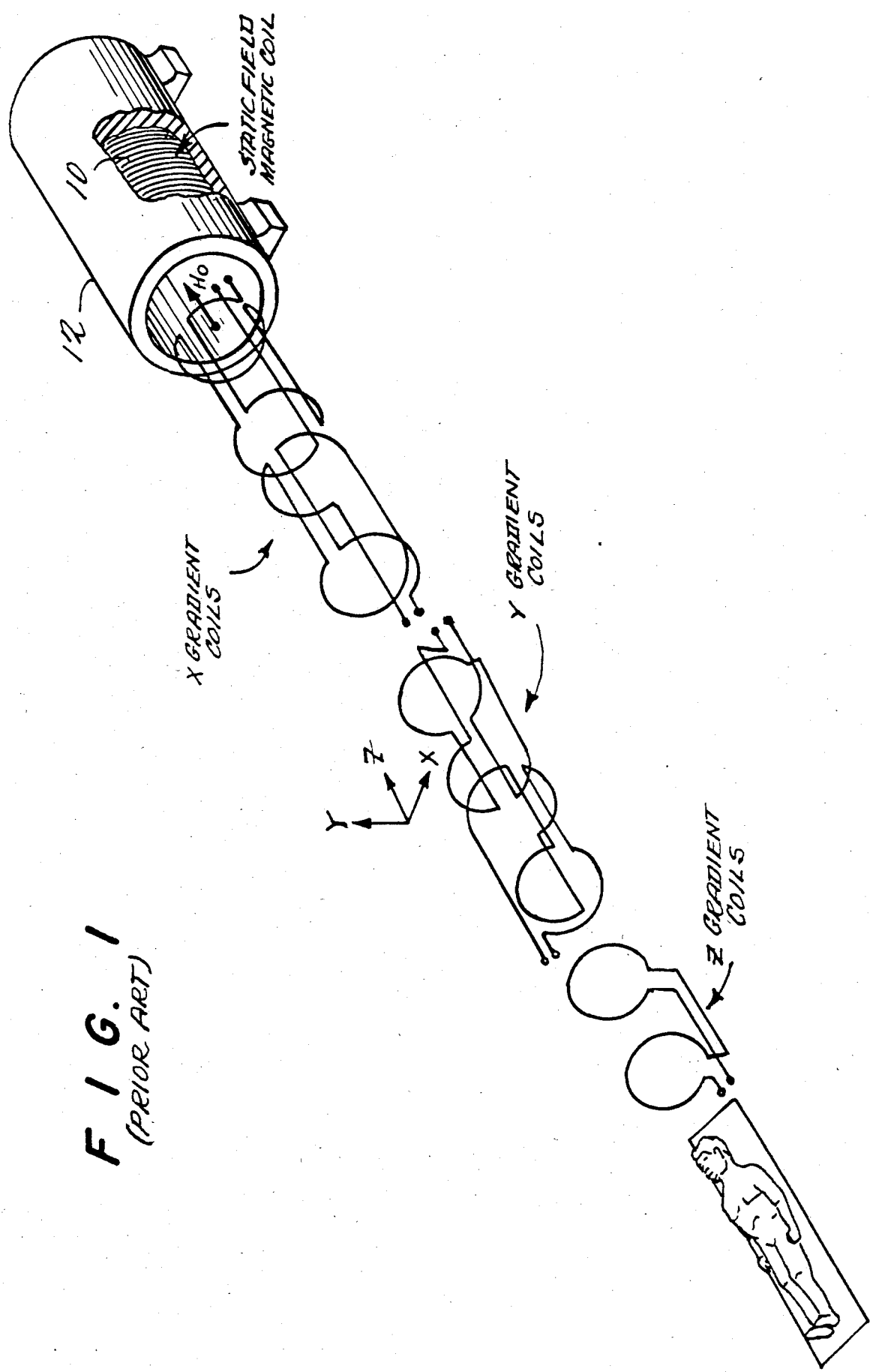
FIG. 1 is an exploded perspective view of a typical arrangement of magnetic gradient coils and static field coil in an NMR imaging apparatus.

FIG. 1 is copied from an earlier copending commonly assigned application Ser. No. 331,008 filed Dec. 15, 1981 merely to show a typical arrangement of magnetic gradient coils used to generate magnetic gradient fields in various dimensions within a static magnetic field $H_0$ generated by a static field magnetic coil 10 within a cryogenic housing 12. As will be appreciated by those in the art and from the above referenced commonly assigned patents and patent application, the gradient fields generated by the gradient coils are pulsed on and off in various sequences so as to elicit NMR signal responses that are spatially encoded.

For purposes of understanding the present invention, it is sufficient to simply appreciate the fact that such gradient coils do exist in NMR imaging apparatus and that they are typically pulsed with currents so as to produce pulsed gradient fields. The frequencies or rates of current/field pulsation associated with the gradient coils is typically in the audio range of frequencies. Certainly it is much lower in frequency than the usual radio frequency signals of interest (e.g. radio frequencies on the order of 15 Megahertz in some typical NMR imaging apparatus).

Figure 2:
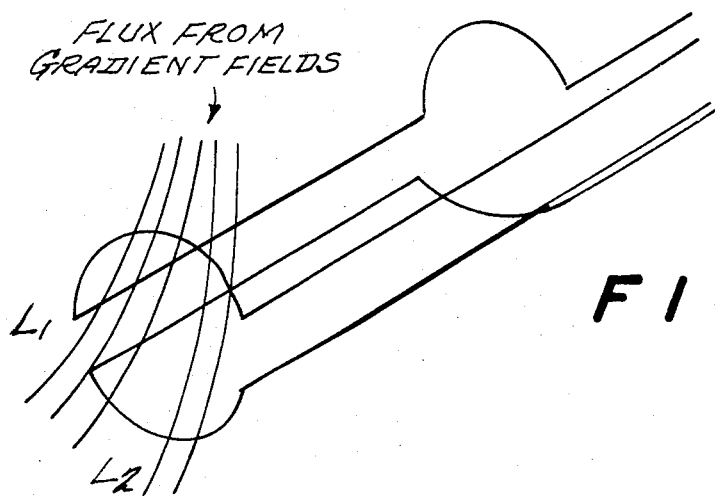
FIG. 2 is a perspective view of a typical radio frequency transmit/receive coil that may be used in conjunction with the gradient coils of FIG. 1 in an NMR imaging apparatus.

Radio frequency electromagnetic signals are coupled to/from the object under test via an r.f. antenna or coil. One desired r.f. coil arrangement is depicted at FIG. 2 which comprises two single turn loops $L_1$ and $L_2$ connected in parallel (thus providing a net inductance equivalent to an approximately ½ turn loop). The reasons for preferring parallel-connected sets of turn(s) will be explained below. As depicted in perspective at FIG. 2, the r.f. coil is typically shaped so as to fit within the static field magnetic coil 10 together with the various X, Y and Z gradient coils. Accordingly, it can be expected that the r.f. coil will be magnetically linked to at least one if not all of the gradient coils that may be present in a given NMR imaging apparatus.

As shown in FIGS. 1 and 2, the r.f. coil would normally be mounted coaxially within the gradient coils and surrounding the patient. As shown in FIG. 2, lines of flux from the gradient fields pass through the turns of the r.f. coil. If the gradient coils and the r.f. coil are aligned perfectly symmetrically, the lines of such flux passing through L1 and L2 would be equal so the induced voltages and currents would be equal and, since the fields are gradients, the currents and voltages would be of opposite polarities. With equal and opposite induced currents and voltages, when one connects L1 and L2 in series or parallel there should thus theoretically be no net current flow through the interconnected coils and therefore no effect of these currents on the gradient field.

In practice, however, it is difficult and often undesirable to have the r.f. coil located perfectly in the center of the gradient fields. For example, if one is using a head-sized coil to image the head of a patient and the physician choses to center the area to be imaged below the center of the patient's head, one must position the patient and coil further into the magnet than the center. However, the patient's shoulders prevent one from centering the coil over the center of the desired area.

In a case where the coil is not centered it is possible to have more lines of flux pass through one coil (e.g. L1) than the other (e.g. L2). In FIG. 2, five lines of flux are shown curving through the r.f. coil. L1 intersects all five flux lines however they curve in such a way that only three of these lines also pass through L2. The voltages and currents thus induced in L1 and L2 are not equal and would not cancel each other if the coils are connected together.

The usual connections of L1 and L2 are shown in FIGS. 3, 4, 5 and 6. In these, L1 and L2 are connected in series so that their voltages add and equal current flows through both. In these Figures capacitors C3 and C4 serve to resonate the coil at the desired r.f. frequency and to match the impedance of the resonant circuit to the (e.g. 50 ohm) impedance of the receiver/transmitter portion of the NMR imager. The impedance matching function of C3 and C4 is described in M. S. Conradi and C. M. Edwards, "Low-Noise Circuitry for Low-Temperature NMR and SQUIDS", Review Sci. Instr. Vol. 4, No. 9, pp. 1219–1220, September, 1977.

In FIGS. 3 and 4, voltage imbalance induced in L1 and L2 by the gradient fields would produce a current through the coil which must also flow through capacitor C3 and then through the parallel combination of C4 and the 50 ohm receiver/transmitter. Since the main role of C3 is to resonate the coil, its impedance at 15 MHz is low but at the audio frequency of the pulsed gradients it is high. For example, with a coil inductance of 2 microhenries and a frequency of 15 MHz, C3 will typically be a little more than 56 picofarads having an impedance of about 188 ohms at 15 MHz. At a typical audio frequency of 1 KHz for the gradients, it will have an impedance of about 2.8 Meg ohm. Thus for every volt of imbalance only 0.35 microampere could flow through the coil.

In FIGS. 5 and 6, the current path is through C3 in parallel with the series combination of C4 and the transmitter/receiver impedance (e.g. 50 ohms). In this case, the coil is resonated by the parallel connection of C3 and C4. Thus the sum of the values of C3 and C4 is again about 56 picofarads so the audio frequency impedance is about 2.8 Meg ohm. The impedance of these standard matching capacitors is sufficiently high to prevent current flow through the r.f. coil which would interfere with the gradient switching. Note also that, in this example, for every volt of imbalance one gets about 67 microvolts of audio frequency signal applied to the receiver when the magnetic gradients are switched. The receiver can easily reject this low frequency signal.

However, as one moves to higher resonant frequencies, the value of the capacitance needed to resonate a given inductance is reduced as shown in the well known equation $2\pi f = 1/\sqrt{LC}$ where f is resonant frequency. The minimum size capacitor which can be used is limited by the stray capacitance of the coil. The coil eventually becomes self resonant with no capacitance connected. As the frequency approaches this self resonance value, the coil efficiency drops. Also, for a given frequency, as the coil size increases (e.g. to accommodate a whole body rather than just a head), the coil inductance increases and the self resonant frequency decreases.

These problems can be reduced if the inductance of the coil can be reduced. This reduction may be achieved, for example, by connecting L1 and L2 in parallel rather than in series. This reduces the inductance by a factor of four compared to the series connection. In the example, this yields an inductance of 0.5 microhenry so that the resonating capacitance would be about 225 picofarad.

Figure 7:
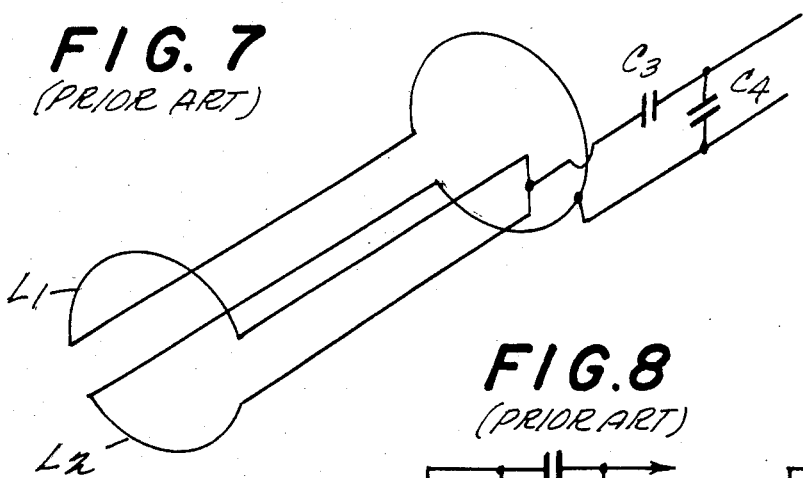
Figure 8:
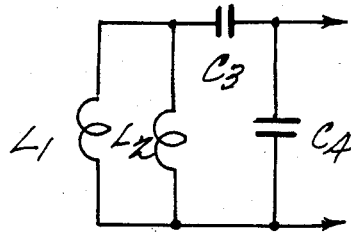
Figure 9:
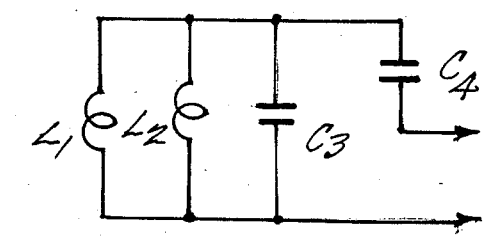

This preferred parallel connection is shown in FIG. 7. The voltages across L1 and L2 now are equal and the signal currents from each add. This provides the same amount of r.f. signal power to the receiver as the series connection. The parallel connection has the additional advantage that there is less voltage across the coil so that the losses due to the associated electric field passing through the tissue of the patient are reduced thus improving image signal to noise ratio. However, the parallel connection of FIG. 7 is more sensitive to mismatching of L1 and L2 since, if they have unequal inductances or sensitivities, part of the signal current from one coil could be dissipated by the other coil. As before, C3 and C4 can be connected in either of two ways to resonate the coil and provide impedance matching (e.g. see FIGS. 8 and 9). With FIGS. 7, 8 and 9 in mind, it is evident that when unequal currents or voltages are induced in L1 and L2 (e.g. by pulsed gradients) the parallel connection of the inductors provides a low impedance path through which the imbalance current will flow.

The impedance of this path at audio frequencies consists almost solely of the resistance of the conductors (usually copper foil) that make up the inductors. It is desirable to have this resistance be as low as possible to provide as little loss at the r.f. frequency as possible (a high Q r.f. coil will make less noise and give a better signal to noise ratio in the image). However, this low resistance allows large audio frequency gradient induced currents to flow. For example, 0.01 ohm resistance of L1 and L2 with an imbalance voltage of 0.1 volt would have a current flow of 10 amperes, a significant amount of current. Capacitors C3 and C4 which before were effective in preventing this current flow are now connected so that they only reduce current flow into the receiver/transmitter. They are not in a position where they can reduce audio current flow from one inductor to the other.

Figure 10:
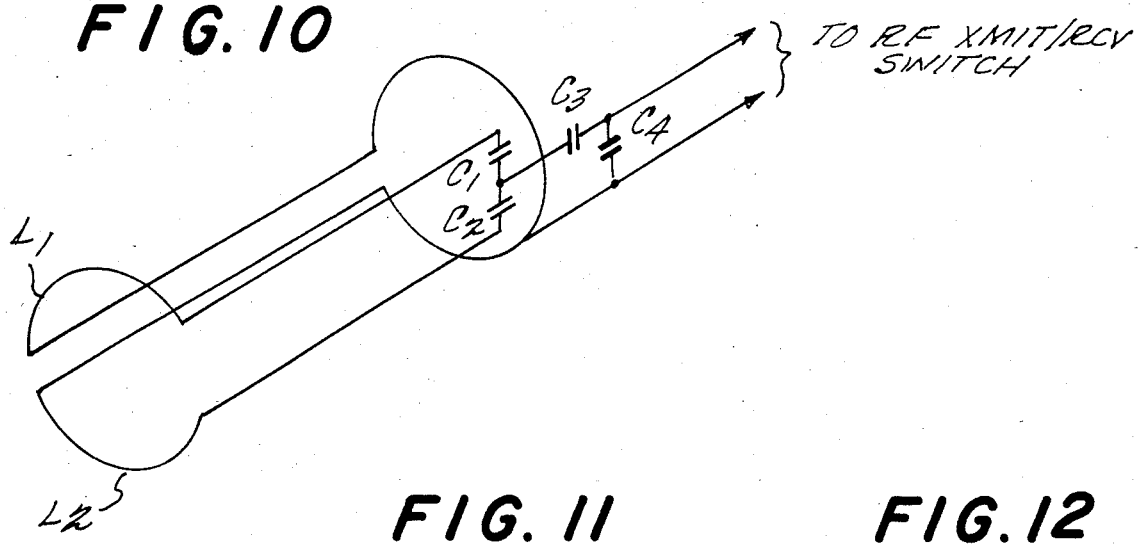
FIGS. 10–12 illustrate two alternative embodiments of r.f. transmit/receive coil arrangements with parallel-connected portions having serial-connected capacitors associated with each (or all but one) such portion in accordance with this invention.
Figure 11:
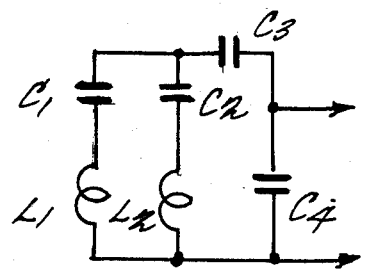
Figure 12:
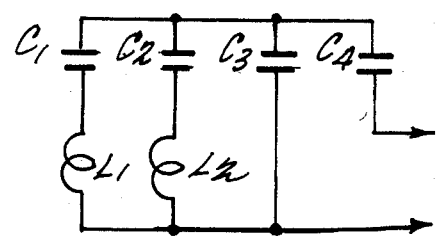

The exemplary embodiment of the invention is shown in FIGS. 10, 11 and 12 where capacitor C1 or C2 or both are placed in series with inductors L1 and L2, respectively. The function of these capacitors is to place a high impedance in the gradient induced current's path while, at the same time, providing a low impedance path for r.f. current through the inductors to the matching network. One chooses the value of the capacitors to have a low impedance at r.f. but a high impedance at audio frequency. A 1500 pf capacitor would, in the example, have an impedance of about 7.1 ohm at 15 MHz and about 106,000 ohms at 1 KHz. In fact, since capacitive reactance is inversely proportional to frequency, the ratio of impedances is just the ratio of the r.f. frequency to the audio frequency. In the example this is 15,000.

If only one of the two capacitors is used the other is replaced by a short circuit. The disadvantage of this approach is that while one of the inductors is directly connected to the matching network, the other has the additional capacitor in its r.f. path. This is an imbalance as far as the r.f. is concerned and should be avoided. Using both C1 and C2 of equal values provides the desired balanced r.f. feed.

In FIG. 11 the tuning and matching function of C3 could be assumed by C1 and C2 if they were both chosen to be of capacitance twice C3. This is a smaller value than suggested for C1 and C2 so the reduction of gradient induced currents would be more effective. The disadvantage is that the tuning function of C3 requires that it be a variable capacitor to accommodate the different tunings required for different patients or the same patient being imaged in different locations. Thus, if C1 and C2 were to include the C3 tuning function, they should be precisely matched each time they are changed.

One common solution would be to use "ganged" variable capacitors. However, these often are constructed using ferromagnetic bearings and shafts making them unsuitable for this application.

The circuit of FIG. 12 is also capable of having the functions of C3 and C4 included in each of the C1 and C2 capacitors by replacing each of the C1 and C2 by pairs of matched C3 and C4 capacitors yielding two sets of matched capacitors.

Many other coil types can benefit from this invention. Any r.f. coil which consists of sets of turns connected in parallel can have each set of turns isolated by application of capacitors in the fashion described. Choosing all of the capacitors to be of equal capacitance provides a balanced r.f. feed. The minimum number of capacitors is one less than the number of sets of turns connected in parallel. An example would be a solenoid made of ten turns, each one in parallel with the others. Ten capacitors each in series with one respective turn would reduce the gradient induced currents and provide a balanced r.f. feed. Nine capacitors could reduce the induction but one coil will then have an r.f. imbalance.

Figure 13:
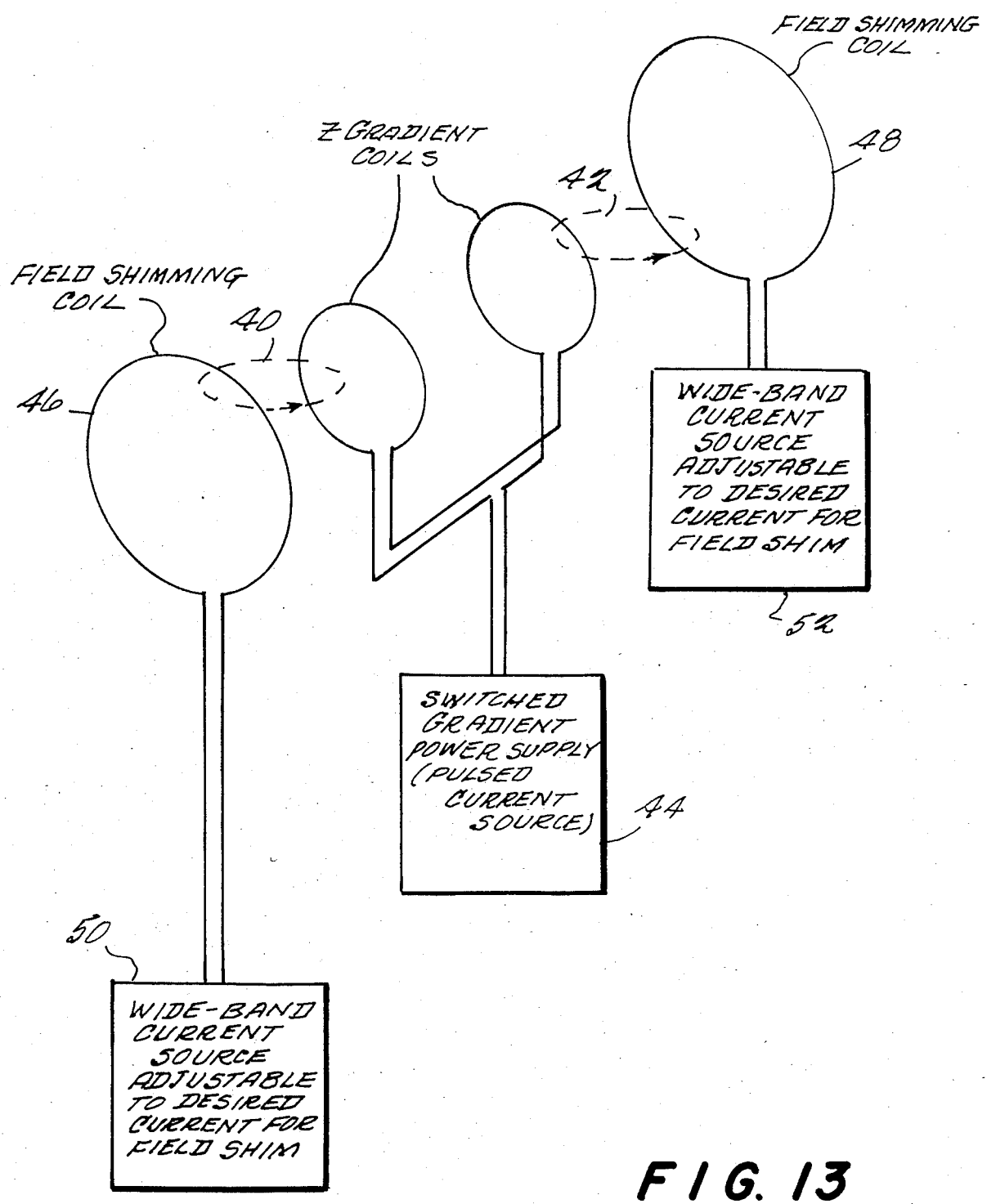
FIG. 13 is a schematic depiction of typical field shimming coils which may be used in the z-axis dimension and magnetically coupled to at least the z-gradient coils of FIG. 1.

FIG. 13 is an exemplary depiction of typical interaction that can be expected between z-gradient producing coils and the field "shimming" (or "profiling") coils that may be included along the z-axis dimension so to help ensure homogeneity of the static magnetic fields. Examples of magnetic flux linkage which can be expected between these sets of coils are depicted by dotted lines 40 and 42 in FIG. 13. Similar magnetic linkage may also affect X and Y axis shimming coils, if present. Furthermore, similar interaction can be expected from the X and Y gradient coils because of expected magnetic linkage to the X and Y pulsed gradient coils.

If such field shimming coils (wherever present, whether in one or more dimensions, so long as magnetically linked to one or more of the pulsed gradient coils) are driven by a voltage source, such magnetic linkage can be expected to induce additional currents in the shimming coils which will flow through the voltage source. In accordance with Lenz's law, the magnetic fields produced by such induced currents can be expected to oppose the desired gradient field which is to be established for some short interval of time (e.g. during the duration of a given "pulse").

However, if the shimming coils are driven by an ideal current source, the magnetic linkage during a field gradient pulse would produce a change of voltage across the current source which would, in turn, not permit a current change in the shimming coil itself. Accordingly, by this mechanism (i.e. by driving the shimming coil with a current source), one can effectively cause the electrical impedance of the shimming coils to be substantially increased with respect to the unwanted induced currents and thus avoid the unwanted generation of induced magnetic fields which oppose the gradient fields that one is attempting to establish for some short interval during an NMR imaging process.

As depicted in FIG. 13, the gradient coils are supplied with pulsed currents by a conventional switched gradient power supply 44. At the same time, the field shimming coils 46, 48 are each driven with a wide-band current source 50 and 52 which may be adjusted to the desired current value for that particular field shim.

As will be appreciated by those in the art, it is not possible to achieve a truly ideal current source in practice. However, a sufficient approximation to the ideal current source can be realized for achieving significant suppression of the unwanted induced currents caused by pulsed gradient fields in NMR imaging apparatus. One exemplary form of such a practical wide band current source that may be used with this invention is a conventional commercially available direct current coupled industrial audio amplifier. For example, one such suitable commercially available device is the Tecron Model 7570 amplifier which includes a constant current input module. This particular amplifier is said to have a bandwidth from direct current to approximately 10 kilohertz, a maximum output voltage of ±100 volts and a maximum current output of approximately ±20 amperes. These are considered adequate specifications for driving a shimming coil with approximately 7 amperes at 20 volts of steady current where the shim coil has an inductance of approximately 80 millihenries. For example, the nominal ±100 volts range of the amplifier might be expected to provide a nominal ±80 volts compliance range for the driving current source.

If less power or compliance is deemed acceptable for a given NMR imaging application, the Tecron Model DC300A dual channel amplifier can be used to operate a pair of coils. For example, each channel may be used in a circuit such as that shown in FIG. 14 as amplifier 50 to drive one of the shimming coils (shown as coil 46 for illustration in FIG. 14). Since no current control module is commercially available for this particular amplifier, in this case one may provide a circuit such as that shown in FIG. 14 so as to convert a DC coupled voltage amplifier into a current source.

Figure 14:
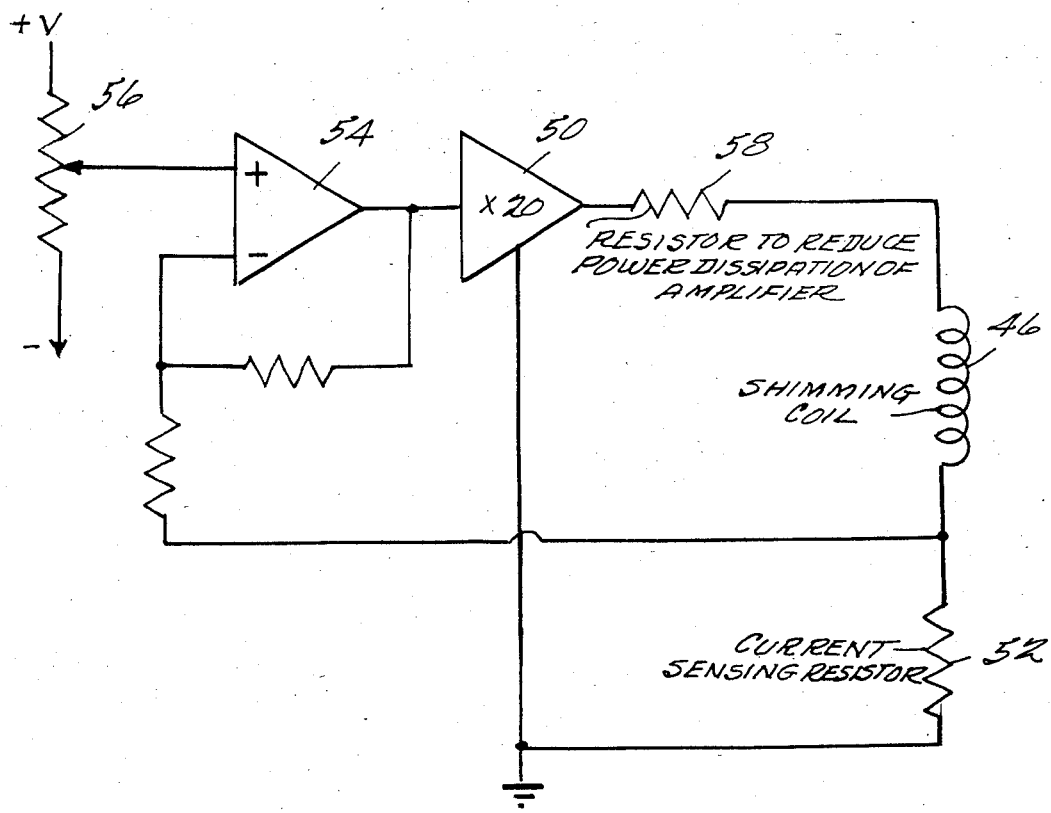
FIG. 14 is a schematic diagram of one exemplary constant current source circuit for use in driving the shimming coils shown in FIG. 13.

The circuit of FIG. 14 is typical of known operational amplifier current sources. For example, a current sensing resistor 52 is provided in series with the shimming coil 46 so as to convert the coil current to a voltage signal which is fed back to differential amplifier 54 where it is compared to a reference voltage (e.g. from a potentiometer 56) corresponding to the desired current. Any difference detected at 54 between the desired current and the actual current is amplified so as to drive the actual current output from amplifier 50 closer to the desired current. With proper dynamic design (in accordance with conventional current source design techniques) in the feedback loop, the output current from amplifier 50 can be expected to reach the desired value as a steady state. Any change of current in the shimming coil 46 (e.g. due to induction by magnetically linked pulsed gradient fields) will be naturally opposed by this constant current control feedback loop. Thus, the net change of current through the shimming coil 46 caused by such pulsed gradient fields will be reduced by the loop gain of the constant current control circuit, which factor can typically be on the order of 1000.

The current sensing resistor 52 is typically chosen so as to provide only a slight loss of potential voltage compliance from the output of amplifier 50. In the exemplary embodiment, it is typically 1 ohm. Since the maximum output voltage of the lower-rated DC300A model amplifier depicted in FIG. 14 is ±60 volts, its power dissipation may be calculated as the current passing through the shimming coil 46 times 60 volts minus the voltage dropped across the coil 46 and the current sensing resistor 52 (assuming for the moment that resistor 58 is 0 ohms) Thus, where the shimming coil current is assumed to be 5 amps and it is assumed that the coil 46 and sensing resistor 52 each have 1 ohm of resistance, then it follows that the power dissipation in the amplifier is equal to $5 \times (60 - 5 \times 2) = 5 \times (60 - 10) = 250$ watts.

Such a large power dissipation may cause the protection circuits in the amplifier to shut it down. However, if a power dissipation resistor 58 is added to the circuit (e.g. a 5 ohm resistor), it could be expected to dissipate some of this power (e.g. 125 watts) thus reducing power dissipation within amplifier 50 (e.g. to approximately 125 watts)—to a level which will not activate the protection circuits of the exemplary 300A model amplifier. At the same time, the power dissipation resistor 58 does necessarily reduce the available range of voltage compliance (e.g. to only approximately ±25 volts). However, in actual practice, this reduced voltage compliance has not been found to be a problem. In one exemplary NMR imaging apparatus, the measured induced voltage across the shim coil due to pulsed gradient fields was only on the order of 1 or 2 volts thus making ±25 volts of compliance more than sufficient for this particular application.

The circuit for driving one shimming coil is shown at FIG. 14, it being understood that other similar circuits would be used for driving each of the other shimming coils that might be present in a given NMR imaging apparatus.

While only one exemplary embodiment of this invention has been described in detail above, those skilled in the art will recognize that there are many possible variations and modifications which may be made in this exemplary embodiment while still retaining many of the novel and advantageous features of this invention. Accordingly, all such variations and modifications are intended to be included within the scope of the following claims.

What is claimed is:

1. NMR imaging apparatus comprising:
   at least one pulsed magnetic field gradient coil for controllably generating audio frequency pulsed magnetic gradient fields;
   a radio frequency signal coil structure having plural parallel-connected coils magnetically linked to said gradient coil and therefore subject to induced audio frequency currents caused by said pulsed gradient fields which induced currents, if permitted to flow, generate magnetic fields opposing the pulsed gradient fields thus limiting the rapidity with which such gradient fields may be pulsed, and
   a capacitor connected in series with each of said parallel-connected coils for causing said parallel-connected coils to have increased electrical impedance with respect to said induced currents, each said capacitor being of equal capacitance so as to maintain a balanced r.f. feed for said radio frequency signal coil while simultaneously substantially impeding passage of said induced audio frequency currents and substantially passing radio frequency signals.

2. NMR imaging apparatus comprising:
   at least one pulsed magnetic field gradient coil for controllably generating pulsed magnetic gradient fields;
   at least one other coil structure magnetically linked to said gradient coil and therefore subject to induced currents caused by said pulsed gradient fields which induced currents, if permitted to flow, generate magnetic fields opposing the pulsed gradient fields; and
   a substantially constant current source electrically connected to supply driving current to said other coil structure for causing it to have increased electrical impedance with respect to said induced currents.

3. NMR imaging apparatus as in claim 2 wherein said other coil is a field shimming coil used for improving the homogeneity of static magnetic fields within said apparatus.

4. NMR imaging apparatus as in claim 3 further comprising a power dissipating resistor connected in series with the constant current source and said field shimming coil.

5. In an NMR imaging apparatus of the type that includes at least one pulsed audio frequency gradient coil magnetically linked to an r.f. signal coil including plural sets of turns connected in parallel, the improvement comprising:

a capacitor connected in series with each of said sets of turns and a common r.f. feed point, each said capacitor having the same capacitance value which substantially impedes passage of said induced audio frequency currents while yet substantially passing radio frequency signals.

6. An improved NMR imaging apparatus of the type that includes at least one pulsed field gradient coil magnetically linked to a static field shimming coil, said improvement comprising:

a constant current source connected to drive a desired constant current through said static field shimming coil.

7. An improved NMR imaging apparatus as in claim 6 further including a power dissipating resistor connected in series with the constant current source and with said shimming coil.

8. In an NMR imaging method using pulsed audio frequency magnetic gradient fields and having at least one radio frequency signal coil structure of plural parallel-connected coils magnetically linked to said pulsed gradient fields, the improvement comprising the step of suppressing the audio frequency currents induced in said coil structure by said pulsed gradient fields, said suppressing step causing the coil structure to have an increased electrical impedance with respect to said induced audio frequency currents, wherein said suppressing step comprises use of at least one capacitor, of equal capacitance, electrically connected in series with each of said parallel-connected coils of said coil structure, the capacitance of said capacitors having a value which substantially impedes passage of said induced audio frequency currents while yet substantially passing radio frequency signals.

9. In an NMR imaging method using pulsed magnetic gradient fields and having at least one coil structure magnetically linked to said pulsed gradient fields, the improvement comprising the step of suppressing the currents induced in said coil by said pulsed gradient fields, said suppressing step causing the coil to have an increased electrical impedance with respect to said induced currents, wherein said suppressing step comprises use of a substantially constant current source electrically connected to supply driving current to said coil structure.

* * * * *